(12) United States Patent
Basheer

(10) Patent No.: US 8,994,210 B2
(45) Date of Patent: Mar. 31, 2015

(54) DRIVER CIRCUIT FOR AN ELECTRIC VEHICLE AND A DIAGNOSTIC METHOD FOR DETERMINING WHEN AN ELECTRICAL SHORT CIRCUIT TO A GROUND VOLTAGE IS PRESENT BETWEEN A CONTACTOR COIL AND A VOLTAGE DRIVER

(75) Inventor: Aneesh Basheer, Dearborn, MI (US)

(73) Assignee: LG Chem, Ltd., Seoul (KR)

( * ) Notice: Subject to any disclaimer, the term of this patent is extended or adjusted under 35 U.S.C. 154(b) by 522 days.

(21) Appl. No.: 13/539,850

(22) Filed: Jul. 2, 2012

(65) Prior Publication Data

US 2014/0001835 A1    Jan. 2, 2014

(51) Int. Cl.
*B60L 3/00* (2006.01)
*B60L 11/18* (2006.01)
*G01R 31/327* (2006.01)

(52) U.S. Cl.
CPC ......... *B60L 11/1803* (2013.01); *G01R 31/3275* (2013.01); *B60L 3/0069* (2013.01); *B60L 11/1861* (2013.01); *B60L 11/1864* (2013.01); *B60L 2240/547* (2013.01); *B60L 2240/549* (2013.01); *Y02T 10/7044* (2013.01); *Y02T 10/7005* (2013.01); *Y02T 10/7061* (2013.01)
USPC ........................................................ 307/10.1

(58) Field of Classification Search
None
See application file for complete search history.

(56) References Cited

U.S. PATENT DOCUMENTS

| 5,369,540 | A | * | 11/1994 | Konrad et al. ..................... 361/6 |
| 5,469,032 | A | | 11/1995 | Otake |
| 5,930,104 | A | * | 7/1999 | Kadah et al. .................. 361/187 |
| 6,275,368 | B1 | * | 8/2001 | Yamada et al. ............... 361/140 |
| 6,919,726 | B2 | | 7/2005 | Yudahira |
| 7,304,402 | B2 | * | 12/2007 | Osawa et al. ................ 307/10.1 |

(Continued)

FOREIGN PATENT DOCUMENTS

| JP | 07087608 A | 3/1995 |
| JP | 09051604 A | 2/1997 |

(Continued)

OTHER PUBLICATIONS

U.S. Appl. No. 13/408,465, filed on Feb. 29, 2012 entitled Driver Circuit for an Electric Vehicle and a Diagnostic Method.

(Continued)

*Primary Examiner* — Rexford Barnie
*Assistant Examiner* — David Shiao
(74) *Attorney, Agent, or Firm* — Buckert Patent & Trademark Law Firm, PC; John F. Buckert

(57) ABSTRACT

A driver circuit and a diagnostic method are provided. The driver circuit includes a first voltage driver, a second voltage driver, and a microprocessor. The microprocessor iteratively measures voltages on first and second sides of a contact to obtain a first plurality of voltage values and a second plurality of voltage values. The microprocessor determines first and second filtered voltage values based on the first and second plurality of voltage values, respectively. The microprocessor de-energizes a contactor coil if both the first filtered voltage value is substantially equal to the second filtered voltage value, and a first filtered current value is less than a threshold current value.

10 Claims, 8 Drawing Sheets

(56) References Cited

U.S. PATENT DOCUMENTS

| | | | |
|---|---|---|---|
| 7,586,214 B2* | 9/2009 | Clarke et al. | 307/130 |
| 2007/0013231 A1 | 1/2007 | Yamashita et al. | |
| 2009/0133671 A1 | 5/2009 | Perryman et al. | |
| 2009/0200973 A1 | 8/2009 | Uchiyama | |
| 2010/0127565 A1 | 5/2010 | Fukazu et al. | |
| 2010/0207635 A1 | 8/2010 | Plagens et al. | |
| 2011/0279975 A1 | 11/2011 | Shimizu et al. | |
| 2012/0105065 A1* | 5/2012 | Namou et al. | 324/415 |

FOREIGN PATENT DOCUMENTS

| | | | |
|---|---|---|---|
| JP | 09163597 A | 6/1997 | |
| JP | 09284902 A | 10/1997 | |
| JP | 2000166281 A | 6/2000 | |
| JP | 2006288163 A | 10/2006 | |
| JP | 2009136077 A | 6/2009 | |
| KR | 200149654 Y1 | 3/1999 | |
| WO | 9418737 A1 | 8/1994 | |

OTHER PUBLICATIONS

U.S. Appl. No. 13/537,161, filed on Jun. 29, 2012 entitled Driver Circuit for an Electric Vehicle and a Diagnostic Method for Determining When First and Second Voltage Drivers Are Shorted to a High Voltage.

U.S. Appl. No. 13/537,236, filed on Jun. 29, 2012 entitled Driver Circuit for an Electric Vehicle and a Diagnostic Method for Determining When a First Voltage Driver is Shorted to a High Voltage and a Second Voltage Driver Has a Low Electrical Current Flowing Therethrough.

U.S. Appl. No. 13/537,510, filed on Jun. 29, 2012 entitled Driver Circuit for an Electric Vehicle and a Diagnostic Method for Determining When a First Voltage Driver is Shorted to a Low Voltage and a Second Voltage Driver is Shorted to a High Voltage.

U.S. Appl. No. 13/540,050, filed on Jul. 2, 2012 entitled Driver Circuit for an Electric Vehicle and a Diagnostic Method for Determining When a Voltage Driver is Shorted to a Ground Voltage.

* cited by examiner

DRIVER CIRCUIT FOR AN ELECTRIC VEHICLE AND A DIAGNOSTIC METHOD FOR DETERMINING WHEN AN ELECTRICAL SHORT CIRCUIT TO A GROUND VOLTAGE IS PRESENT BETWEEN A CONTACTOR COIL AND A VOLTAGE DRIVER

BACKGROUND

The inventor herein has recognized a need for an improved driver circuit for an electric vehicle and a diagnostic method for determining when an electrical short circuit to a ground voltage is present between a contactor coil and a voltage driver.

SUMMARY

A driver circuit for an electric vehicle in accordance with an exemplary embodiment is provided. The driver circuit includes a first voltage driver having a first input line and a first output line. The first input line is coupled to a microprocessor. The first output line is coupled to a first side of a contactor coil of a contactor. The driver circuit further includes a second voltage driver having a second input line, a second output line, and a second voltage sense line. The second input line is coupled to the microprocessor. The second output line is coupled to a second side of the contactor coil. The second voltage sense line is coupled to the microprocessor. The microprocessor is configured to generate a first pulse width modulated signal on the first input line to induce the first voltage driver to output a second pulse width modulated signal on the first output line that is received by the first side of the contactor coil to energize the contactor coil. The microprocessor is further configured to iteratively measure a voltage on a first side of a contact in the contactor over time to obtain a first plurality of voltage values. The microprocessor is further configured to determine a first filtered voltage value based on the first plurality of voltage values. The microprocessor is further configured to iteratively measure a voltage on a second side of the contact in the contactor over time to obtain a second plurality of voltage values. The microprocessor is further configured to determine a second filtered voltage value based on the second plurality of voltage values. The microprocessor is further configured to iteratively measure a voltage on the second voltage sense line over time to obtain a third plurality of voltage values indicative of an amount of electrical current flowing through the second voltage driver. The microprocessor is further configured to determine a first filtered current value based on the third plurality of voltage values. The microprocessor is further configured to stop generating the first pulse width modulated signal to de-energize the contactor coil if both the first filtered voltage value is substantially equal to the second filtered voltage value, and the first filtered current value is less than a threshold current value, indicating that an electrical short circuit to a ground voltage is present between the contactor coil and the second voltage driver.

A diagnostic method for a driver circuit for an electric vehicle in accordance with another exemplary embodiment is provided. The driver circuit has a first voltage driver, a second voltage driver, and a microprocessor. The first voltage driver has a first input line and a first output line. The first input line is coupled to the microprocessor. The first output line is coupled to a first side of a contactor coil of a contactor. The second voltage driver has a second input line, a second output line, and a second voltage sense line. The second input line is coupled to the microprocessor. The second output line is coupled to a second side of the contactor coil. The second voltage sense line is coupled to the microprocessor. The method includes generating a first pulse width modulated signal on the first input line utilizing the microprocessor to induce the first voltage driver to output a second pulse width modulated signal on the first output line that is received by the first side of the contactor coil to energize the contactor coil. The method further includes iteratively measuring a voltage on a first side of a contact in the contactor over time to obtain a first plurality of voltage values utilizing the microprocessor. The method further includes determining a first filtered voltage value based on the first plurality of voltage values utilizing the microprocessor. The method further includes iteratively measuring a voltage on a second side of the contact in the contactor over time to obtain a second plurality of voltage values utilizing the microprocessor. The method further includes determining a second filtered voltage value based on the second plurality of voltage values utilizing the microprocessor. The method further includes iteratively measuring a voltage on the second voltage sense line over time to obtain a third plurality of voltage values indicative of an amount of electrical current flowing through the second voltage driver utilizing the microprocessor. The method further includes determining a first filtered current value based on the third plurality of voltage values utilizing the microprocessor. The method further includes stopping the generating of the first pulse width modulated signal to de-energize the contactor coil if both the first filtered voltage value is substantially equal to the second filtered voltage value, and the first filtered current value is less than a threshold current value, indicating that an electrical short circuit to a ground voltage is present between the contactor coil and the second voltage driver, utilizing the microprocessor.

DETAILED DESCRIPTION

Figure 1:
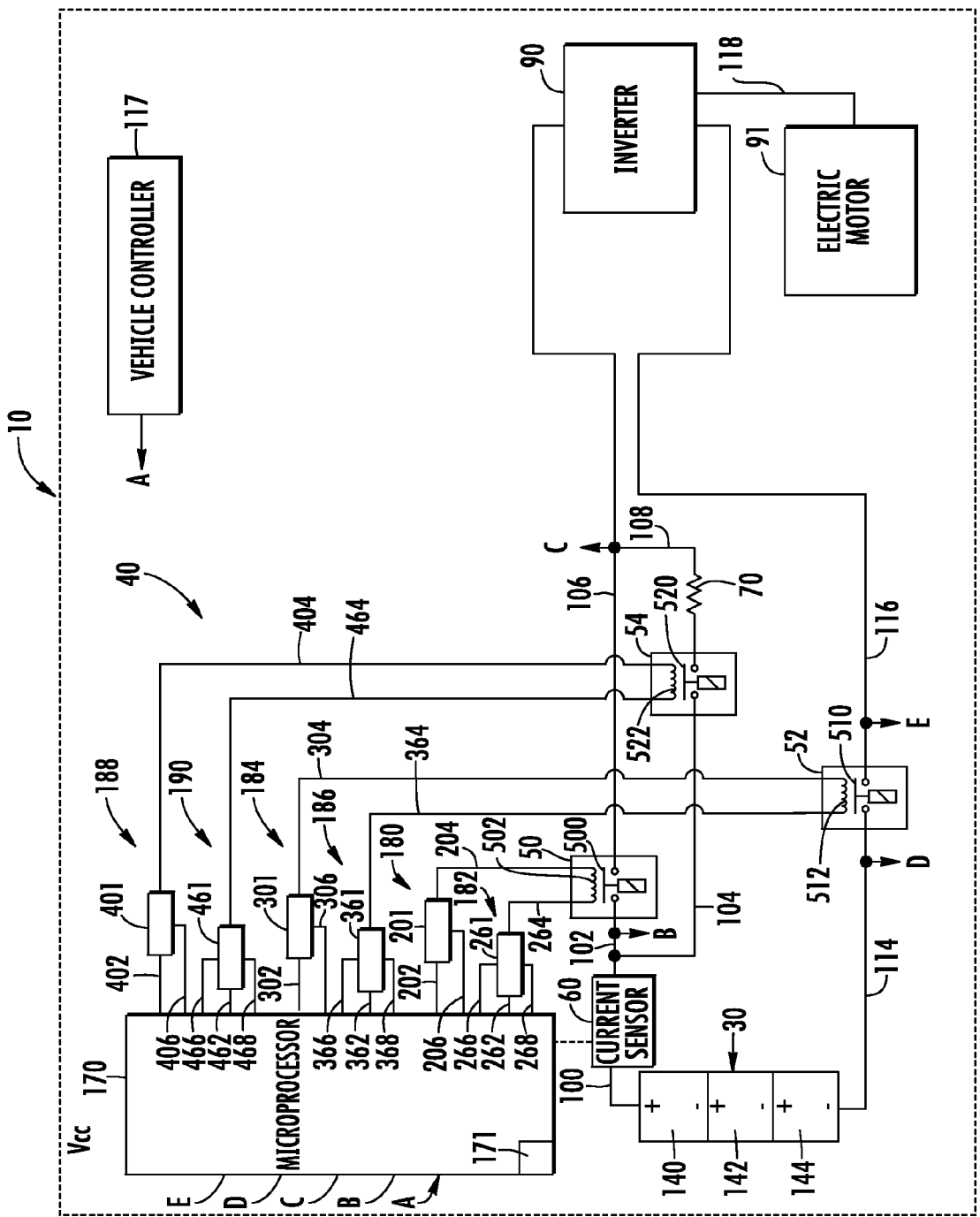
FIG. 1 is a block diagram of an electric vehicle having a driver circuit in accordance with an exemplary embodiment.
Figure 2:
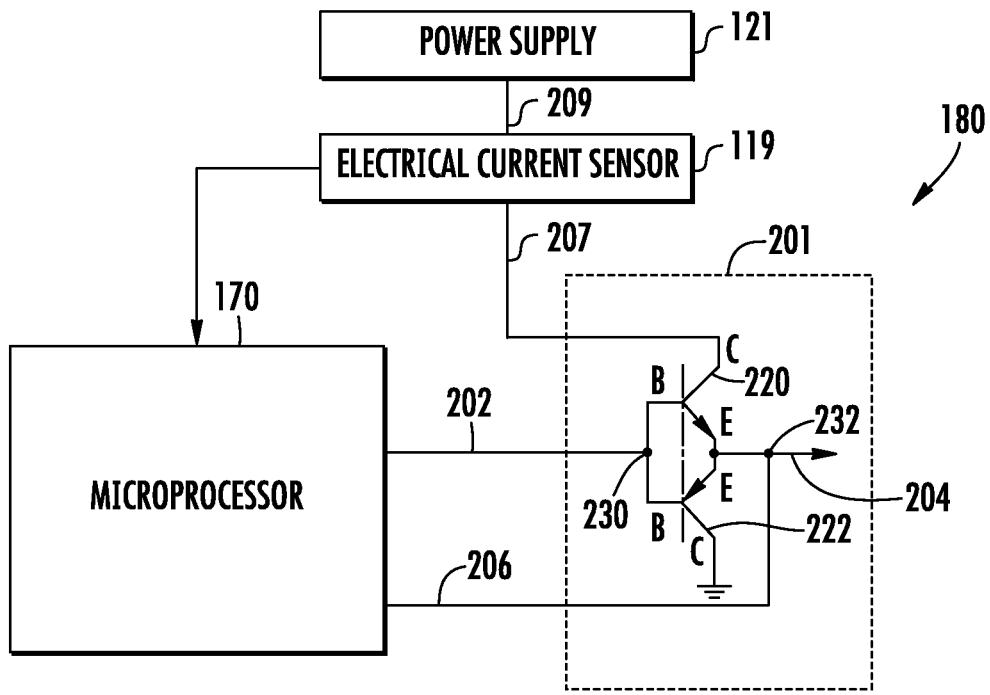
FIG. 2 is a schematic of a first voltage driver utilized in the driver circuit of FIG. 1.
Figure 3:
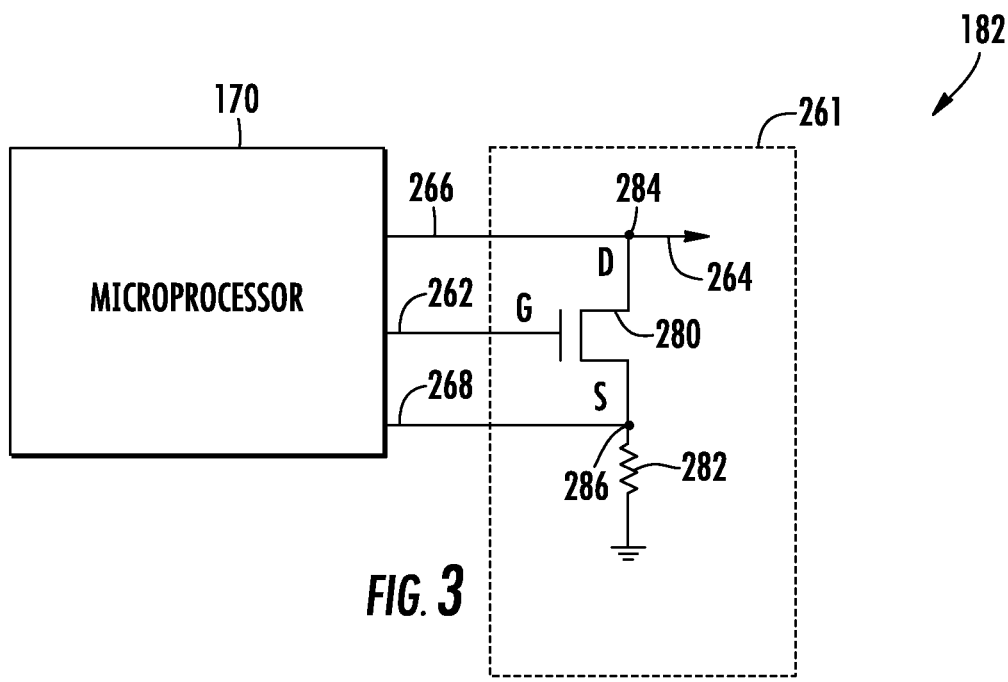
FIG. 3 is a schematic of a second voltage driver utilized in the driver circuit of FIG. 1.
Figure 4:
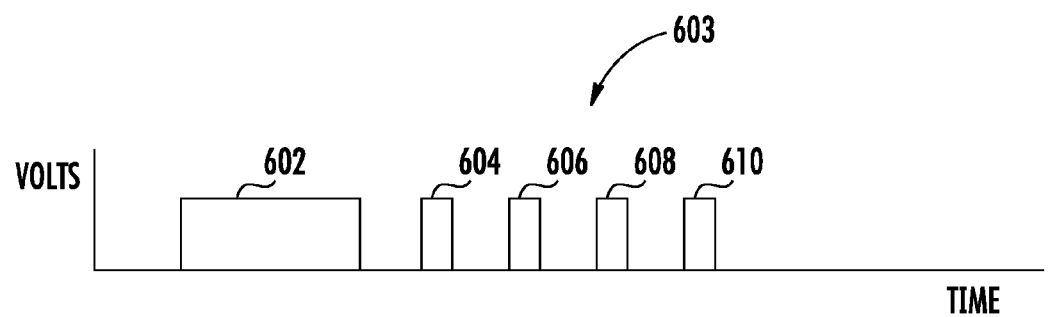
FIG. 4 is a schematic of a first set of voltage pulses output by the driver circuit of FIG. 1.
Figure 5:
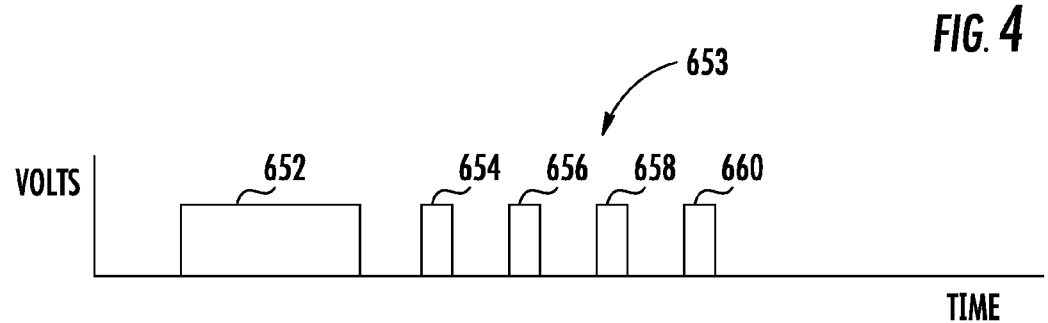
FIG. 5 is a schematic of a second set of voltage pulses output by the driver circuit of FIG. 1.
Figure 6:
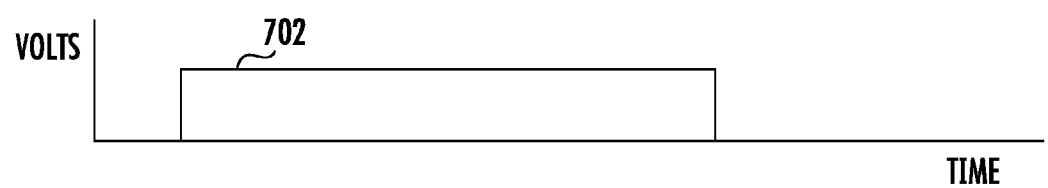
FIG. 6 is a schematic of a signal output by the driver circuit of FIG. 1.
Figure 7:
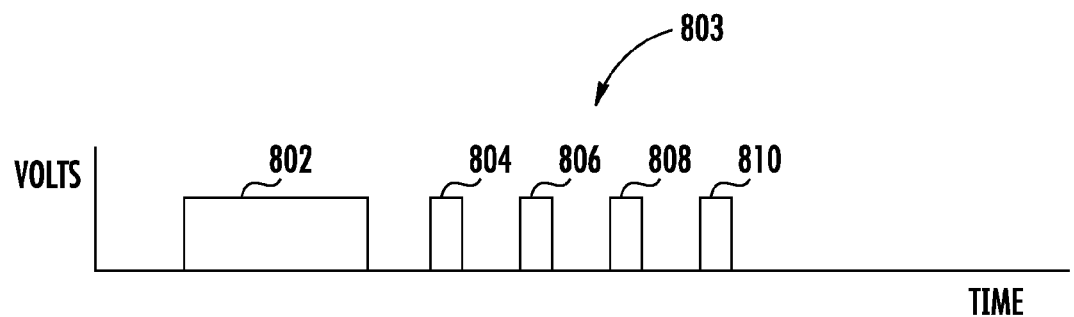
FIG. 7 is a schematic of a third set of voltage pulses output by the driver circuit of FIG. 1.
Figure 8:
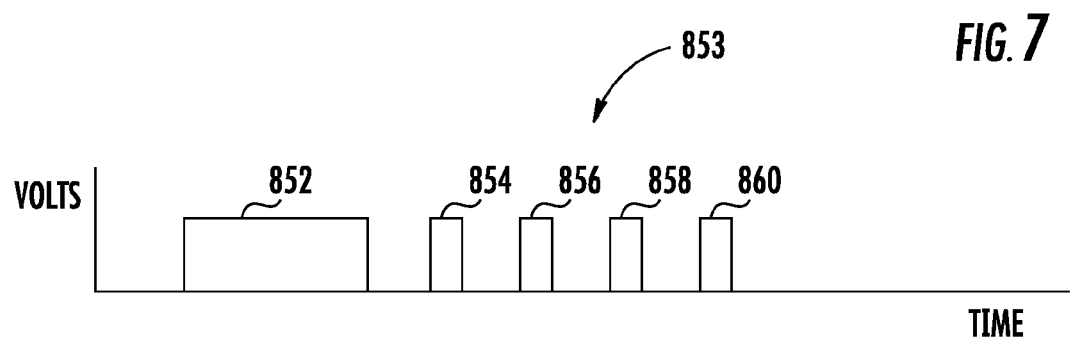
FIG. 8 is a schematic of a fourth set of voltage pulses output by the driver circuit of FIG. 1.
Figure 9:
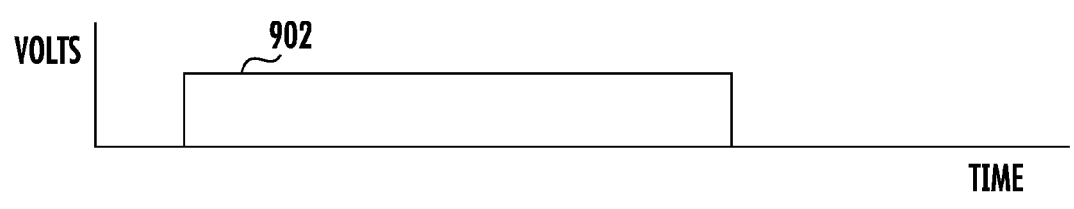
FIG. 9 is a schematic of another signal output by the driver circuit of FIG. 1.
Figure 10:
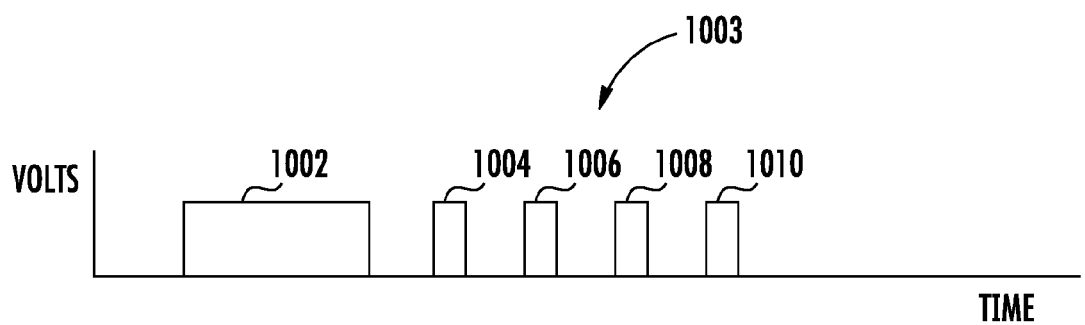
FIG. 10 is a schematic of a fifth set of voltage pulses output by the driver circuit of FIG. 1.
Figure 11:
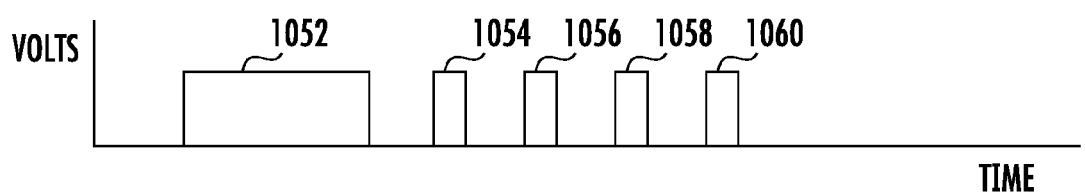
FIG. 11 is a schematic of a sixth set of voltage pulses output by the driver circuit of FIG. 1.
Figure 12:
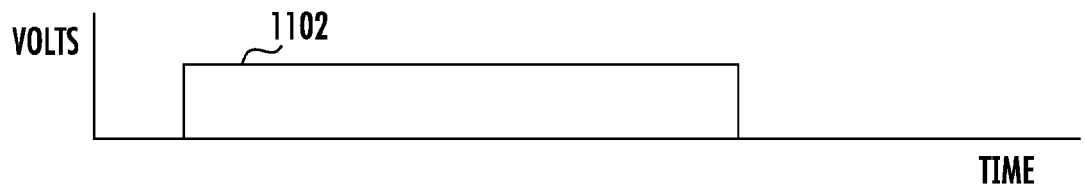
FIG. 12 is a schematic of another signal output by the driver circuit of FIG. 1.
Figure 13:
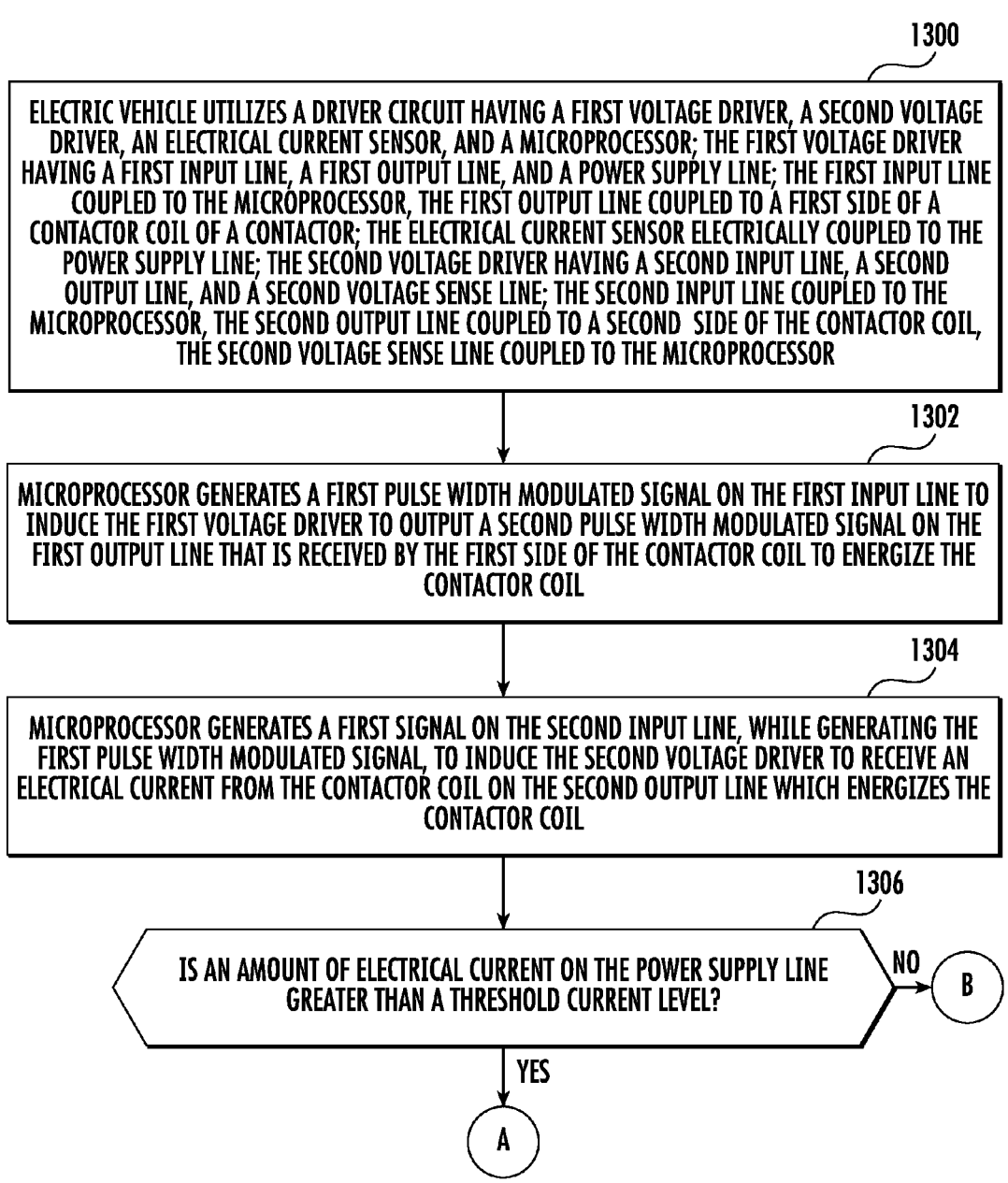
FIGS. 13-15 are flowcharts of a diagnostic method in accordance with another exemplary embodiment.
Figure 14:
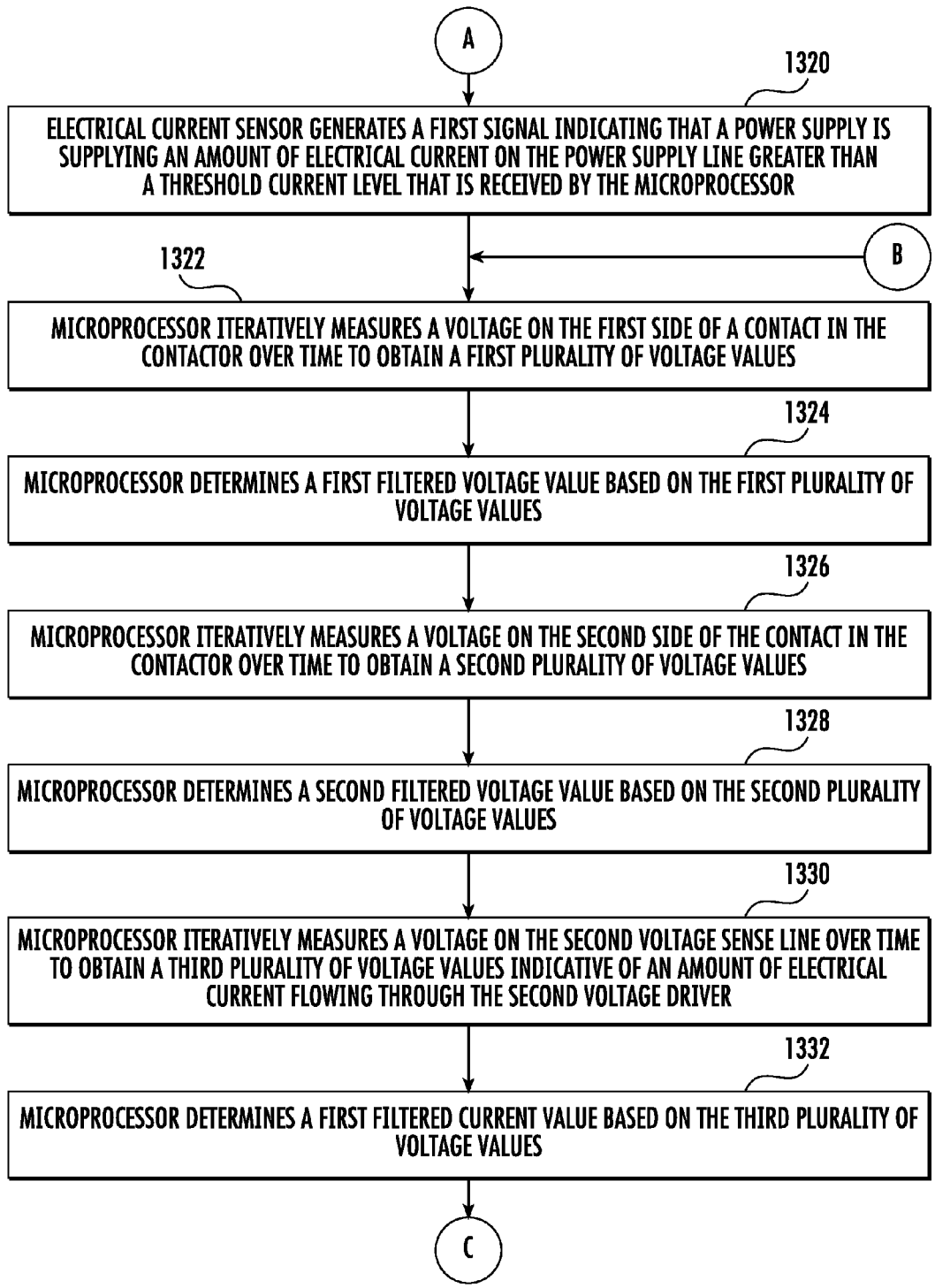
Figure 15:
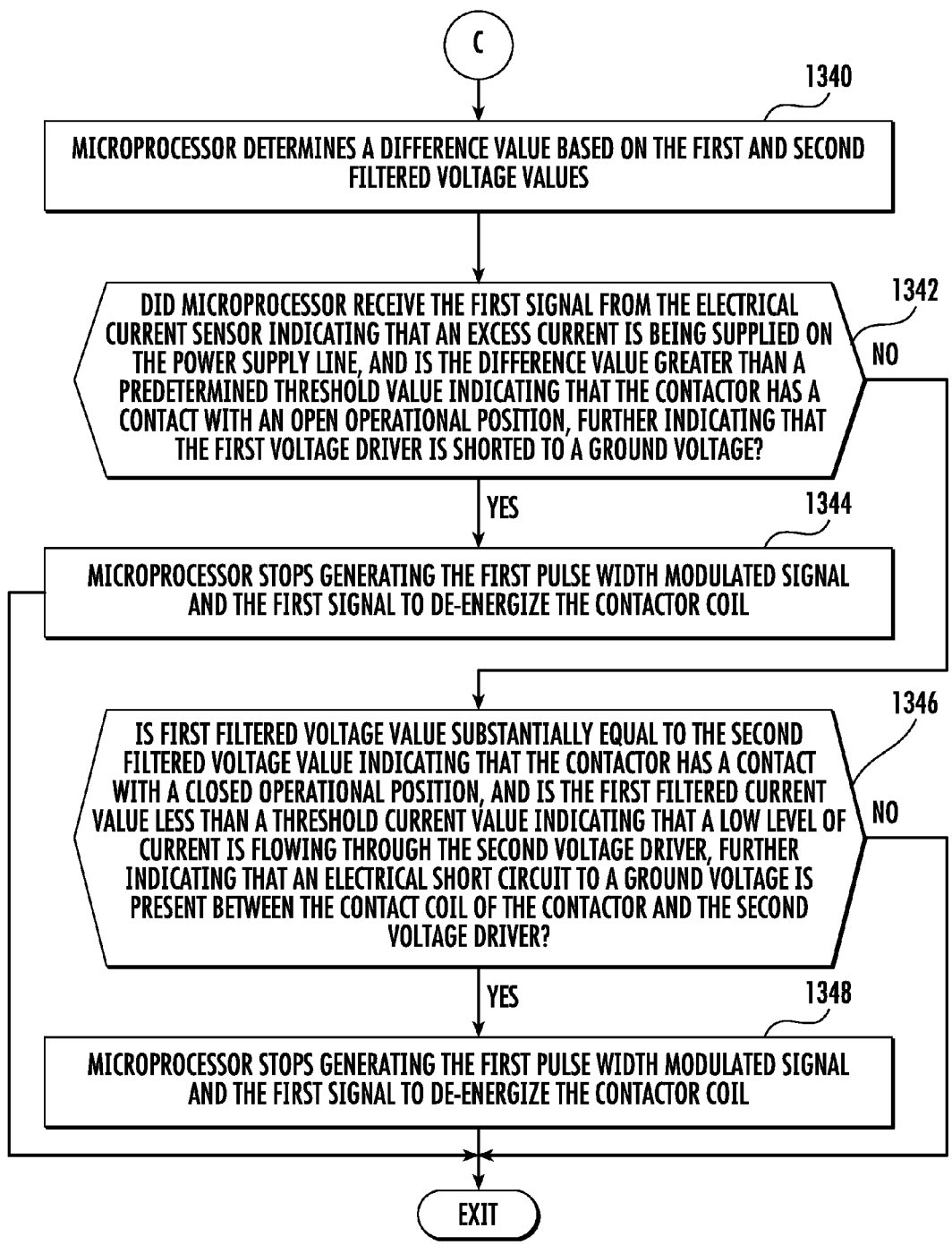

Referring to FIGS. 1-3, an electric vehicle 10 having a driver circuit 40 in accordance with an exemplary embodiment is provided. The electric vehicle 10 further includes a battery pack 30, a main contactor 50, a grounding contactor 52, a pre-charge contactor 54, an electrical current sensor 60, a resistor 70, a high voltage inverter 90, an electric motor 91, electrical lines 100, 102, 104, 106, 108, 114, 116, 118, a vehicle controller 117, an electrical current sensor 119, and a power supply 121. An advantage of the driver circuit 40 is that the driver circuit 40 performs a diagnostic algorithm to determine when an electrical short circuit to a ground voltage is present between a contactor coil and a voltage driver.

Before explaining the structure and operation of the electric vehicle 10, a brief explanation of some of the terms utilized herein will be provided.

The term "filtered voltage value" refers to a voltage value that is determined based on a plurality of voltage values. A filtered voltage value can be determined utilizing a filter equation.

The term "filtered current value" refers to a current value that is determined based on a plurality of voltage values or a plurality of current values. A filtered current value can be determined utilizing a filter equation.

The term "filter equation" refers to an equation that is used to calculate a value based on a plurality of values. In exemplary embodiments, a filter equation can comprise a first order lag filter or an integrator for example. Of course, other types of filter equations known to those skilled in the art could be utilized.

The term "high voltage" refers to a voltage greater than an expected voltage during a predetermined operational mode of the driver circuit. For example, if an expected voltage at a predetermined location in the driver circuit is 4 volts (e.g., 12 volts at a 30% duty cycle) in a predetermined operational mode of the driver circuit, an actual voltage of 4.5 volts at the predetermined location in the driver circuit could be considered a high voltage.

The term "high logic voltage" refers to a voltage in the driver circuit that corresponds to a Boolean logic value of "1."

The battery pack 30 is configured to output an operational voltage to the high voltage inverter 90 which outputs operational voltages to the electric motor 91 via the electrical lines 118. The battery pack 30 includes battery modules 140, 142, 144 electrically coupled in series with one another.

The driver circuit 40 is configured to control operational positions of the main contactor 50, the grounding contactor 52, and the pre-charge contactor 54. The driver circuit 40 includes a microprocessor 170, a first voltage driver 180, a second voltage driver 182, a third voltage driver 184, a fourth voltage driver 186, a fifth voltage driver 188, and a sixth voltage driver 190.

The microprocessor 170 is configured to generate control signals for controlling operation of the first voltage driver 180, the second voltage driver 182, the third voltage driver 184, the fourth voltage driver 186, the fifth voltage driver 188, and the sixth voltage driver 190. The microprocessor 170 is further configured to execute a software program stored in a memory device 171 for implementing a diagnostic algorithm associated with the driver circuit 40 as will be explained below. The memory device 171 is configured to store software algorithms, values, and status flags therein. The microprocessor 170 is operably coupled to a Vcc voltage source that supplies an operational voltage (e.g., 5 Volts) to the microprocessor 170.

Before explaining the diagnostic algorithm associated with the driver circuit 40 in accordance with an exemplary embodiment, the structure and operation of the driver circuit 40 will be explained.

Referring to FIGS. 1 and 2, the first voltage driver 180 and the second voltage driver 182 are utilized to energize the main contactor coil 502 to induce the contact 500 to have a closed operational position, and to de-energize the main contactor coil 502 to induce the contact 500 to have an open operational position.

Referring to FIGS. 1 and 4-6, during operation, when the microprocessor 170 outputs both the initial voltage pulse 602, and the first signal 702 on the input lines 202, 262, respectively, of the first and second voltage drivers 180, 182, respectively; the voltage drivers 180, 182 energize the main contactor coil 502 to induce the contact 500 to have a closed operational position. In particular, in response to the first voltage driver 180 receiving the initial voltage pulse 602, the first voltage driver 180 outputs the initial voltage pulse 652 to energize the main contactor coil 502.

After generating the initial voltage pulse 602, the microprocessor 170 outputs the pulse width modulated signal 603 having the voltage pulses 604, 606, 608, 610 with a duty cycle of about 30%. Of course, the duty cycle of the voltage pulses 604, 606, 608, 610 could be less than 30% or greater than 30%.

Further, after generating the initial voltage pulse 602, the microprocessor 170 continues outputting the first signal 702 which has a high logic voltage while generating the voltage pulses 604, 606, 608, 610. The first signal 702 turns on the transistor 280 in the second voltage driver 182.

In particular, in response to the first voltage driver 180 receiving the pulse width modulated signal 603, the first voltage driver 180 outputs the pulse width modulated signal 653 (shown in FIG. 5) to maintain energization the main contactor coil 502. The pulse width modulated signal 653 includes the voltage pulses 654, 656, 658, 660 with a duty cycle of about 30%. Of course, the duty cycle of the voltage pulses 654, 656, 658, 660 could be less than 30% or greater than 30%.

When the microprocessor 170 stops outputting the pulse width modulated signal 603 and the first signal 702 on the input lines 202, 262, respectively, of the first and second voltage drivers 180, 182, respectively, the voltage drivers 180, 182 de-energize the main contactor coil 502 to induce the contact 500 to have an open operational position.

Referring to FIGS. 1 and 2, the first voltage driver 180 includes a driver circuit 201, an input line 202, an output line 204, and a voltage sense line 206. The input line 202 is coupled to both the microprocessor 170 and to the driver circuit 201. The output line 204 is electrically coupled to a first side of the main contactor coil 502. The voltage sense line 206 is coupled to both the output line 204 and to the microprocessor 170.

In one exemplary embodiment, the driver circuit 201 includes transistors 220, 222. The transistor 220 has: (i) a base (B) coupled to a node 230 that is further coupled to the microprocessor 170, (ii) a collector (C) coupled to a power supply 121 via power supply lines 207, 209, and (iii) an emitter coupled to a node 232 which is further coupled to the output line 204. The electrical current sensor 119 is electrically coupled in series with the power supply lines 207, 209, and is configured to generate a signal when the power supply 121 is supplying an amount of electrical current on the power supply line 207 that is greater than a threshold current level. The signal from the electrical current sensor 119 is received by the microprocessor 170.

The transistor 222 has: (i) a base (B) coupled to the node 230 that is further coupled to the microprocessor 170, (ii) a collector (C) coupled to electrical ground, and (iii) an emitter coupled to the node 232. When the microprocessor 170 applies a high logic voltage to node 230, the transistor 220 is turned on and the transistor 222 is turned off and a voltage (e.g., 12 volts) from the power supply 121 is applied to the node 232 and the output line 204 which is further applied to a first end of the main contactor coil 502. Alternately, when the microprocessor 170 stops applying the high logic voltage to node 230, the transistor 220 is turned off and the transistor 222 is turned on and a ground voltage is applied to the node 232 and the output line 204 which is further applied to the first end of the main contactor coil 502.

Referring to FIGS. 1 and 3, the second voltage driver 182 includes a driver circuit 261, an input line 262, an output line 264, a voltage sense line 266, and a voltage sense line 268. The input line 262 is coupled to both the microprocessor 170 and to the driver circuit 261. The output line 264 is electrically coupled to a second side of the main contactor coil 502. The voltage sense line 266 coupled to both the output line 264 and to the microprocessor 170. When the main contactor coil 502 is energized, the voltage sense line 268 receives a voltage indicative of a first current in the main contactor coil 502 and is coupled to the microprocessor 170.

In one exemplary embodiment, the driver circuit 261 includes a transistor 280 and a resistor 282. The transistor 280 has: (i) a gate (G) coupled to the microprocessor 170, (ii) a drain (D) coupled to a node 284 that is further coupled to both the voltage sense line 266 and to the output line 264, and (iii) a source (S) coupled to a resistor 282. The resistor 282 is coupled between the source (S) and electrical ground. A node 286 at a first end of the resistor 282 is further coupled to the microprocessor 170 through the voltage sense line 268. When the microprocessor 170 applies a high logic voltage to the gate (G), the transistor 280 turns on and allows electrical current from the main contactor coil 502 to flow through the transistor 280 and the resistor 282 to ground. Alternately, when the microprocessor 170 stops applying the high logic voltage to the gate (G), the transistor 280 turns off and does not allow electrical current to flow through the main contactor coil 502, the transistor 280, and the resistor 282.

Referring to FIG. 1, the third voltage driver 184 and the fourth voltage driver 186 are utilized to energize the grounding contactor coil 512 to induce the contact 510 to have a closed operational position, and to de-energize the grounding contactor coil 512 to induce the contact 510 to have an open operational position.

Referring to FIGS. 1 and 7-9, during operation, when the microprocessor 170 outputs both the initial voltage pulse 802, and the first signal 902 on the input lines 302, 362 of the third and fourth voltage drivers 184, 186, respectively; the voltage drivers 184, 186 energize the grounding contactor coil 512 to induce the contact 510 to have a closed operational position. In particular, in response to the third voltage driver 184 receiving the initial voltage pulse 802, the third voltage driver 184 outputs the initial voltage pulse 852 to energize the grounding contactor coil 512.

After generating the initial voltage pulse 802, the microprocessor 170 outputs the pulse width modulated signal 803 having the voltage pulses 804, 806, 808, 810 with a duty cycle of about 30%. Of course, the duty cycle of the voltage pulses 804, 806, 808, 810 could be less than 30% or greater than 30%.

Further, after generating the initial voltage pulse 802, the microprocessor 170 continues outputting the first signal 902 which has a high logic voltage while generating the voltage pulses 804, 806, 808, 810, to continue to turn on a transistor, like the transistor 280, in the fourth voltage driver 186.

In particular, in response to the third voltage driver 184 receiving the pulse width modulated signal 803, the third voltage driver 184 outputs the pulse width modulated signal 853 (shown in FIG. 8) to energize the grounding contactor coil 512. The pulse width modulated signal 853 includes the voltage pulses 854, 856, 858, 860 having a duty cycle of about 30%. Of course, the duty cycle of the voltage pulses 854, 856, 858, 860 could be less than 30% or greater than 30%.

When the microprocessor 170 stops outputting the pulse width modulated signal 803, and the first signal 902 on the input lines 302, 362, respectively, of the third and fourth voltage drivers 184, 186, respectively, the voltage drivers 184, 186 de-energize the grounding contactor coil 512 to induce the contact 510 to have an open operational position.

Referring to FIGS. 1 and 2, the third voltage driver 184 includes a driver circuit 301, an input line 302, an output line 304, and a voltage sense line 306. The input line 302 is coupled to both the microprocessor 170 and to the driver circuit 301. The output line 304 is electrically coupled to a first side of the grounding contactor coil 512. The voltage sense line 306 is coupled to both the output line 304 and to the microprocessor 170. In one exemplary embodiment, the structure of the driver circuit 301 is identical to the structure of the driver circuit 201 discussed above. Further, the driver circuit 201 is coupled to the power supply 121 via a series combination of a respective first power supply line (not shown), a respective electrical current sensor (not shown), and a respective second power supply line (not shown).

Referring to FIGS. 1 and 3, the fourth voltage driver 186 includes a driver circuit 361, an input line 362, an output line 364, a voltage sense line 366, and a voltage sense line 368. The input line 362 is coupled to both the microprocessor 170 and to the driver circuit 361. The output line 364 is electrically coupled to a second side of the grounding contactor coil 512. The voltage sense line 366 coupled to both the output line 364 and to the microprocessor 170. When the grounding contactor coil 512 is energized, the voltage sense line 368 receives a signal indicative of a second current in the grounding contactor coil 512 and is coupled to the microprocessor 170. In one exemplary embodiment, the structure of the driver circuit 361 is identical to the structure of the driver circuit 261.

The fifth voltage driver 188 and the sixth voltage driver 190 are utilized to energize the pre-charge contactor coil 522 to induce the contact 520 to have a closed operational position, and to de-energize the pre-charge contactor coil 522 to induce the contact 520 to have an open operational position.

Referring to FIGS. 1 and 10-12, during operation, when the microprocessor 170 outputs both the initial voltage pulse 1002, and the first signal 1102 on the input lines 402, 462, respectively, of the fifth and sixth voltage drivers 188, 190, respectively; the voltage drivers 188, 190 energize the pre-charge contactor coil 522 to induce the contact 520 to have a closed operational position. In particular, in response to the fifth voltage driver 188 receiving the initial voltage pulse 1002, the fifth voltage driver 188 outputs the initial voltage pulse 1052 to energize the grounding contactor coil 512.

After generating the initial voltage pulse 1002, the microprocessor 170 outputs the pulse width modulated signal 1003 having the voltage pulses 1004, 1006, 1008, 1010 with a duty cycle of about 30%. Of course, the duty cycle of the voltage pulses 1004, 1006, 1008, 1010 could be less than 30% or greater than 30%.

Further, after generating the initial voltage pulse 1002, the microprocessor 170 continues outputting the first signal 1102 which has a high logic voltage while generating the voltage pulses 1004, 1006, 1008, 1010, to continue to turn on a transistor, like the transistor 280, in the sixth voltage driver 190.

In response to the fifth voltage driver 188 receiving the pulse width modulated signal 1003, the fifth voltage driver 188 outputs the pulse width modulated signal 1053 to energize the pre-charge contactor coil 522. The pulse width modulated signal 1053 includes the voltage pulses 1054, 1056, 1058, 1060 having a duty cycle of about 30%. Of course, the duty cycle of the voltage pulses 1054, 1056, 1058, 1060 could be less than 30% or greater than 30%.

When the microprocessor 170 stops outputting the pulse width modulated signal 1003, and the first signal 1102 on the input lines 402, 462, respectively, of the fifth and sixth voltage drivers 188, 190, respectively; the voltage drivers 188, 190 de-energize the pre-charge contactor coil 522 to induce the contact 520 to have an open operational position.

The fifth voltage driver 188 includes a driver circuit 401, an input line 402, an output line 404, and a voltage sense line 406. The input line 402 is coupled to both the microprocessor 170 and to the driver circuit 401. The output line 404 is electrically coupled to a first side of the pre-charge contactor coil 522. The voltage sense line 406 is coupled to both the output line 404 and to the microprocessor 170. In one exemplary embodiment, the structure of the driver circuit 401 is identical to the structure of the driver circuit 201 discussed above. Further, the driver circuit 401 is coupled to the power supply 121 via a series combination of a respective first power supply line (not shown), a respective electrical current sensor (not shown), and a respective second power supply line (not shown).

The sixth voltage driver 190 includes a driver circuit 461, an input line 462, an output line 464, a voltage sense line 466, a voltage sense line 468. The input line 462 is coupled to both the microprocessor 170 and to the driver circuit 461. The output line 464 is electrically coupled to a second side of the pre-charge contactor coil 522. The voltage sense line 466 coupled to both the output line 464 and to the microprocessor 170. When the pre-charge contactor coil 522 is energized, the voltage sense line 468 receives a signal indicative of a third current in the pre-charge contactor coil 522 and is coupled to the microprocessor 170. In one exemplary embodiment, the structure of the driver circuit 461 is identical to the structure of the driver circuit 261.

The main contactor 50 is electrically coupled in series with the battery pack 30, the current sensor 60 and the inverter 90. In particular, a positive voltage terminal of the battery pack 100 is electrically coupled to the current sensor 60 via the electrical line 100. The current sensor 60 is electrically coupled to a first end of the contact 500 of the main contactor 50 via the electrical line 102. Also, a second end of the contact 500 is electrically coupled to the inverter 90 via the electrical line 106. When the main contactor coil 502 is energized, the contact 500 has a closed operational position and electrically couples a positive voltage terminal of the battery pack 30 to the inverter 90. When the main contactor coil 502 is de-energized, the contact 500 has an open operational position and electrically de-couples the positive voltage terminal of the battery pack 30 from the inverter 90.

The grounding contactor 52 is electrically coupled in series between the battery pack 30 and the inverter 90. A negative voltage terminal of the battery pack 30 is electrically coupled to a first end of the contact 510 of the grounding contactor 52 via the electrical line 114. Also, a second end of the contact 510 is electrically coupled to the inverter 90 via the electrical line 116. When the grounding contactor coil 512 is energized, the contact 510 has a closed operational position and electrically couples a negative voltage terminal of the battery pack 30 to the inverter 90. When the grounding contactor coil 512 is de-energized, the contact 510 has an open operational position and electrically de-couples the negative voltage terminal of the battery pack 30 from the inverter 90.

The pre-charge contactor 54 is electrically coupled in parallel to the main contactor 50. A first end of the contact 520 is electrically coupled to the electrical line 102 via the electrical line 104. A second end of the contact 520 is electrically coupled to the electrical line 106 via the resistor 70 and the electrical line 108. When the pre-charge contactor coil 522 is energized, the contact 520 has a closed operational position and electrically couples a positive voltage terminal of the battery pack 30 to the inverter 90. When the pre-charge contactor coil 522 is de-energized, the contact 520 has an open operational position and electrically de-couples the positive voltage terminal of the battery pack 30 from the inverter 90.

The electrical current sensor 60 is configured to generate a signal indicative of a total amount of current being supplied by the battery pack 30 to the electric motor 90. The microprocessor 170 receives the signal from the electrical current sensor 60. The electrical current sensor 60 is electrically coupled in series between a positive voltage terminal of the battery pack 30 and a first end of the contact 500.

Referring to FIGS. 1, 4-7, and 13-16, a flowchart of diagnostic method for the driver circuit 40 of the electric vehicle 10 when at least one of the main contactor coil 502, the grounding contactor coil 512, and the pre-charge contactor coil 522 are energized will now be explained. The diagnostic method determines when an electrical short circuit to a ground voltage is present between a contactor coil and a voltage driver. For purposes of simplicity, the following diagnostic method will be explained with reference to the main contactor coil 502 and the first and second voltage drivers 180, 182 for controlling the main contactor coil 502. However, it should be understood that the following diagnostic method can be utilized with grounding contactor coil 512 and/or the pre-charge contactor coil 522 and the associated voltage drivers therewith.

At step 1300, the electric vehicle 10 utilizes the driver circuit 40 having the first voltage driver 180, the second voltage driver 182, the electrical current sensor 119, and the microprocessor 170. The first voltage driver 180 has the input line 202, the output line 204, and the power supply line 207. The input line 202 is coupled to the microprocessor 170. The output line 204 is coupled to a first side of the contactor coil 502 of the contactor 50. The electrical current sensor 119 is electrically coupled to the power supply line 207. The second voltage driver 182 has the input line 262, the output line 264, and the voltage sense line 268. The input line 262 is coupled to the microprocessor 170. The output line 264 is coupled to a second side of the contactor coil 502. The voltage sense line 268 is coupled to the microprocessor 170. After step 1300, the method advances to step 1302.

At step 1302, the microprocessor 170 generates a first pulse width modulated signal 603 on the input line 202 to induce the first voltage driver 180 to output a second pulse width modulated signal 653 on the output line 204 that is received by the first side of the contactor coil 502 to energize the contactor coil 502. After step 1302, the method advances to 1304.

At step 1304, the microprocessor 170 generates a first signal 702 on the input line 262, while generating the first pulse width modulated signal, to induce the second voltage driver 182 to receive an electrical current from the contactor coil 502 on the output line 264 which energizes the contactor coil 502. After step 1304, the method advances to step 1306.

At step 1306, the electrical current sensor 119 makes a determination as to whether an amount of electrical current on the power supply line 207 is greater than a threshold current level. If the value of step 1306 equals "yes", the method advances to step 1320. Otherwise, the method advances to step 1322.

At step 1320, the electrical current sensor 119 generates a first signal indicating that the power supply 121 is supplying an amount of electrical current on the power supply line 207 that is greater than a threshold current level. The first signal is received by the microprocessor 170. After step 1320, the method advances to step 1322.

Referring again to step 1306, if the value of step 1306 equals "no", the method advances to step 1322. At step 1322, the microprocessor 170 iteratively measures a voltage on a first side of the contact 500 in the contactor 50 over time to obtain a first plurality of voltage values. After step 1322, the method advances to step 1324.

At step 1324, the microprocessor 170 determines a first filtered voltage value based on the first plurality of voltage values. In one exemplary embodiment, the first filter equation is a first order lag filter equation. For example, in one exemplary embodiment, the first filter equation is as follows: first filtered voltage value=first filtered voltage value$_{Old}$+(voltage value of one of first plurality of voltage values−first filtered voltage value$_{Old}$)*Gain$_{Calibration}$. It is noted that the foregoing equation is iteratively calculated utilizing each of the voltage values of the first plurality of voltage values.

At step 1326, the microprocessor 170 iteratively measures a voltage on a second side of the contact 500 in the contactor 50 over time to obtain a second plurality of voltage values. The step 1326 may be substantially simultaneously performed with the step 1322. After step 1326, the method advances to step 1328.

At step 1328, the microprocessor 170 determines a second filtered voltage value based on the second plurality of voltage values. In one exemplary embodiment, the second filter equation is a first order lag filter equation. For example, in one exemplary embodiment, the second filter equation is as follows: second filtered voltage value=second filtered voltage value$_{Old}$+(voltage value of one of second plurality of voltage values−second filtered voltage value$_{Old}$)*Gain$_{Calibration}$. It is noted that the foregoing equation is iteratively calculated utilizing each of the voltage values of the second plurality of voltage values.

At step 1330, the microprocessor 170 iteratively measures a voltage on the voltage sense line 268 over time to obtain a third plurality of voltage values indicative of an amount of electrical current flowing through the second voltage driver 182. The step 1330 may be substantially simultaneously performed with the step 1326. After step 1330, the method advances to step 1332.

At step 1332, the microprocessor 170 determines a first filtered current value based on the third plurality of voltage values. In one exemplary embodiment, the first filtered current equation is a first order lag filter equation. For example, in one exemplary embodiment, the first filtered current equation is as follows: first filtered current value=first filtered current value$_{Old}$+((voltage value of one of second plurality of voltage values/resistance of resistor 282)−first filtered current value$_{Old}$))*Gain$_{Calibration}$. It is noted that the foregoing equation is iteratively calculated utilizing each of the voltage values of the second plurality of voltage values. The first filtered current value is indicative of an amount of electrical current flowing through the contactor coil 502. After step 1332, the method advances to step 1340.

At step 1340, the microprocessor 170 determines a difference value based on the first and second filtered voltage values. In one exemplary embodiment, the difference value is calculated utilizing the following equation: difference value=first filtered voltage value−second filtered voltage value. After step 1340, the method advances to step 1342.

At step 1342, the microprocessor 170 makes a determination as to whether the microprocessor 170 received the first signal from the electrical current sensor 119 indicating that an excess current is being supplied on the power supply line 207, and whether the difference value is greater than a predetermined threshold value indicating that the contact 500 has an open operational position, wherein both of the foregoing conditions further indicate that the first voltage driver 180 is shorted to a ground voltage. It should be noted that the first voltage driver 180 can either be directly shorted to a ground voltage, or indirectly shorted to a ground voltage through other components in the driver circuit 40. If the value of step 1342 equals "yes", the method advances to step 1344. Otherwise, the method advances to step 1346.

At step 1344, the microprocessor 170 stops generating the first pulse width modulated signal 603 and the first signal 702 to de-energize the contactor coil 502. After step 1344, the method is exited.

Referring again to step 1342, if the value of step 1342 equals "no", the method advances to step 1346. At step 1346, the microprocessor 170 makes a determination as to whether the first filtered voltage value is substantially equal to the second filtered voltage value indicating that the contact 500 has a closed operational position, and whether the first filtered current value is less than a threshold current value indicating that a low level of current is flowing through the second voltage driver 182, wherein both of the foregoing conditions indicate that an electrical short circuit to a ground voltage is present between the contact 500 and the second voltage driver 182. If the value of step 1346 equals "yes", the method advances to step 1348. Otherwise, the method is exited.

At step 1348, the microprocessor 170 stops generating the first pulse width modulated signal 603 and the first signal 702 to de-energize the contactor coil 502. After step 1348, the method is exited.

The driver circuit 40 and the diagnostic method provide a substantial advantage over other circuits and methods. In particular, the driver circuit 40 and the diagnostic method provide a technical effect of determining when an electrical short circuit to a ground voltage is present between a contactor coil and a voltage driver.

The above-described diagnostic method can be at least partially embodied in the form of one or more computer readable media having computer-executable instructions for practicing the methods. The computer-readable media can comprise one or more of the following: hard drives, RAM memory, flash memory, and other computer-readable media known to those skilled in the art; wherein, when the computer-executable instructions are loaded into and executed by one or more computers or microprocessors, the one or more computers or microprocessors become an apparatus for practicing the methods.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A driver circuit for an electric vehicle, comprising:
a first voltage driver having a first input line and a first output line, the first input line coupled to a microprocessor, the first output line coupled to a first side of a contactor coil of a contactor;
a second voltage driver having a second input line, a second output line, and a second voltage sense line; the second input line coupled to the microprocessor, the second output line coupled to a second side of the contactor coil, the second voltage sense line coupled to the microprocessor;
the microprocessor configured to generate a first pulse width modulated signal on the first input line to induce the first voltage driver to output a second pulse width modulated signal on the first output line that is received by the first side of the contactor coil to energize the contactor coil;
the microprocessor further configured to iteratively measure a voltage on a first side of a contact in the contactor over time to obtain a first plurality of voltage values;
the microprocessor further configured to determine a first filtered voltage value based on the first plurality of voltage values;
the microprocessor further configured to iteratively measure a voltage on a second side of the contact in the contactor over time to obtain a second plurality of voltage values;
the microprocessor further configured to determine a second filtered voltage value based on the second plurality of voltage values;
the microprocessor further configured to iteratively measure a voltage on the second voltage sense line over time to obtain a third plurality of voltage values indicative of an amount of electrical current flowing through the second voltage driver;
the microprocessor further configured to determine a first filtered current value based on the third plurality of voltage values; and
the microprocessor further configured to stop generating the first pulse width modulated signal to de-energize the contactor coil if both the first filtered voltage value is substantially equal to the second filtered voltage value, and the first filtered current value is less than a threshold current value, indicating that an electrical short circuit to a ground voltage is present between the contactor coil and the second voltage driver.

2. The driver circuit of claim 1, wherein the microprocessor is further configured to generate a first signal on the second input line to induce the second voltage driver to receive the electrical current from the contactor coil on the second output line which energizes the contactor coil.

3. The driver circuit of claim 2, wherein the microprocessor is further configured to stop generating the first signal to de-energize the contactor coil if both the first filtered voltage value is substantially equal to the second filtered voltage value, and the first filtered current value is less than the threshold current value.

4. The driver circuit of claim 2, wherein the first signal has a high logic voltage while the first pulse width modulated signal is being generated.

5. The driver circuit of claim 1, wherein when the first filtered voltage value is substantially equal to the second filtered voltage value the contact has a closed operational position.

6. A diagnostic method for a driver circuit for an electric vehicle, the driver circuit having a first voltage driver, a second voltage driver, and a microprocessor; the first voltage driver having a first input line and a first output line, the first input line coupled to the microprocessor, the first output line coupled to a first side of a contactor coil of a contactor; the second voltage driver having a second input line, a second output line, and a second voltage sense line; the second input line coupled to the microprocessor, the second output line coupled to a second side of the contactor coil, the second voltage sense line coupled to the microprocessor; the method comprising:
generating a first pulse width modulated signal on the first input line utilizing the microprocessor to induce the first voltage driver to output a second pulse width modulated signal on the first output line that is received by the first side of the contactor coil to energize the contactor coil;
iteratively measuring a voltage on a first side of a contact in the contactor over time to obtain a first plurality of voltage values utilizing the microprocessor;
determining a first filtered voltage value based on the first plurality of voltage values utilizing the microprocessor;
iteratively measuring a voltage on a second side of the contact in the contactor over time to obtain a second plurality of voltage values utilizing the microprocessor;
determining a second filtered voltage value based on the second plurality of voltage values utilizing the microprocessor;
iteratively measuring a voltage on the second voltage sense line over time to obtain a third plurality of voltage values indicative of an amount of electrical current flowing through the second voltage driver utilizing the microprocessor;
determining a first filtered current value based on the third plurality of voltage values utilizing the microprocessor; and
stopping the generating of the first pulse width modulated signal to de-energize the contactor coil if both the first filtered voltage value is substantially equal to the second filtered voltage value, and the first filtered current value is less than a threshold current value, indicating that an electrical short circuit to a ground voltage is present between the contactor coil and the second voltage driver, utilizing the microprocessor.

7. The diagnostic method of claim 6, further comprising generating a first signal on the second input line utilizing the microprocessor to induce the second voltage driver to receive the electrical current from the contactor coil on the second output line which energizes the contactor coil.

8. The diagnostic method of claim 7, further comprising stopping the generating of the first signal to de-energize the contactor coil if both the first filtered voltage value is substantially equal to the second filtered voltage value, and the first filtered current value is less than the threshold current value.

9. The diagnostic method of claim 7, wherein the first signal has a high logic voltage while the first pulse width modulated signal is being generated.

10. The diagnostic method of claim 6, wherein when the first filtered voltage value is substantially equal to the second filtered voltage value the contact has a closed operational position.

* * * * *